United States Patent
Shi et al.

(10) Patent No.: US 10,294,802 B2
(45) Date of Patent: May 21, 2019

(54) TURBINE ENGINE COMPONENTS WITH CHEMICAL VAPOR INFILTRATED ISOLATION LAYERS

(71) Applicants: Rolls-Royce Corporation, Indianapolis, IN (US); Rolls-Royce North American Technologies, Inc., Indianapolis, IN (US)

(72) Inventors: Jun Shi, Carmel, IN (US); Robert J. Shinavski, Mission Viejo, CA (US)

(73) Assignees: Rolls-Royce American Technologies, Inc., Indianapolis, IN (US); Rolls-Royce Corporation, Indianapolis, IN (US)

( * ) Notice: Subject to any disclaimer, the term of this patent is extended or adjusted under 35 U.S.C. 154(b) by 518 days.

(21) Appl. No.: 14/956,849

(22) Filed: Dec. 2, 2015

(65) Prior Publication Data
US 2016/0160660 A1    Jun. 9, 2016

Related U.S. Application Data

(60) Provisional application No. 62/087,948, filed on Dec. 5, 2014.

(51) Int. Cl.
*B32B 18/00* (2006.01)
*F01D 11/00* (2006.01)
(Continued)

(52) U.S. Cl.
CPC ............... *F01D 5/284* (2013.01); *B32B 3/30* (2013.01); *B32B 5/26* (2013.01); *B32B 9/041* (2013.01); *B32B 15/14* (2013.01); *B32B 18/00* (2013.01); *C04B 37/025* (2013.01); *C23C 16/045* (2013.01); *C23C 16/325* (2013.01); *F01D 5/02* (2013.01); *F01D 5/147* (2013.01); *F01D 5/282* (2013.01); *F01D 5/3092* (2013.01); *F01D 11/006* (2013.01); *B32B 2255/02* (2013.01); *B32B 2255/20* (2013.01);
(Continued)

(58) Field of Classification Search
CPC .......... B32B 7/04; B32B 7/045; B32B 9/005; B32B 15/00; B32B 15/04; B32B 15/046; B32B 15/14; B32B 18/00; F05D 2300/514; F05D 2300/6033; F01D 5/02; F01D 5/147; F01D 5/202; F01D 5/284
USPC ........................................................... 428/457
See application file for complete search history.

(56) References Cited

U.S. PATENT DOCUMENTS

| | | |
|---|---|---|
| 4,942,732 A | 7/1990 | Priceman |
| 5,304,031 A | 4/1994 | Sudhangshu |

(Continued)

FOREIGN PATENT DOCUMENTS

WO    WO-2007112783 A1  * 10/2007    ............... C23C 4/04

*Primary Examiner* — Catherine A. Simone
(74) *Attorney, Agent, or Firm* — Shumaker & Sieffert, P.A.

(57) ABSTRACT

An assembly for use in a gas turbine engine and method for making the same are described herein. The assembly comprising a CMC component, a metallic component spaced apart from the CMC component, and a spacer. The spacer having a first surface in contact with the CMC and a second surface opposite the first surface in contact with the metallic component, the spacer comprising a CMC substantially free of silicon metal with a porosity of between about 5 percent and about 40 percent by volume to chemically isolate the CMC component from the metallic component.

19 Claims, 2 Drawing Sheets

(51) Int. Cl.
  *C23C 16/04* (2006.01)
  *F01D 5/02* (2006.01)
  *F01D 5/14* (2006.01)
  *F01D 5/28* (2006.01)
  *F01D 5/30* (2006.01)
  *B32B 15/14* (2006.01)
  *C23C 16/32* (2006.01)
  *B32B 9/04* (2006.01)
  *C04B 37/02* (2006.01)
  *B32B 5/26* (2006.01)
  *B32B 3/30* (2006.01)

(52) U.S. Cl.
  CPC ... *B32B 2262/105* (2013.01); *B32B 2307/306* (2013.01); *B32B 2603/00* (2013.01); *C04B 2237/04* (2013.01); *C04B 2237/06* (2013.01); *C04B 2237/083* (2013.01); *C04B 2237/365* (2013.01); *C04B 2237/38* (2013.01); *C04B 2237/40* (2013.01); *C04B 2237/405* (2013.01); *C04B 2237/592* (2013.01); *C04B 2237/61* (2013.01); *C04B 2237/708* (2013.01); *F05D 2220/32* (2013.01); *F05D 2230/314* (2013.01); *F05D 2230/60* (2013.01); *F05D 2240/30* (2013.01); *F05D 2240/55* (2013.01); *F05D 2300/10* (2013.01); *F05D 2300/21* (2013.01); *F05D 2300/222* (2013.01); *F05D 2300/2261* (2013.01); *F05D 2300/514* (2013.01); *F05D 2300/6033* (2013.01); *F05D 2300/614* (2013.01)

(56) References Cited

U.S. PATENT DOCUMENTS

| | | |
|---|---|---|
| 6,132,175 A | 10/2000 | Cai et al. |
| 6,335,105 B1 | 1/2002 | McKee |
| 6,464,456 B2 | 10/2002 | Darolia et al. |
| 7,052,234 B2 | 5/2006 | Wells et al. |
| 7,329,101 B2 | 2/2008 | Carper et al. |
| 8,721,290 B2 | 5/2014 | Darkins, Jr. et al. |
| 8,777,583 B2 | 7/2014 | Darkins, Jr. et al. |
| 2012/0009071 A1 | 1/2012 | Tanahashi et al. |

\* cited by examiner

TURBINE ENGINE COMPONENTS WITH CHEMICAL VAPOR INFILTRATED ISOLATION LAYERS

CROSS REFERENCE TO RELATED APPLICATIONS

This application claims priority to and the benefit of U.S. Provisional Patent Application No. 62/087,948, filed 5 Dec. 2014, the disclosure of which is now expressly incorporated herein by reference.

FIELD OF THE DISCLOSURE

The present disclosure relates generally to an assembly for a gas turbine engine, and more specifically to a ceramic composite spacer.

BACKGROUND

Gas turbine engine components are exposed to high temperature environments with an increasing demand for even higher temperatures. Economic and environmental concerns relating to the reduction of emissions and the increase of efficiency are driving the demand for higher gas turbine operating temperatures. In order to meet these demands, temperature capability of the components in hot sections such as blades, vanes, blade tracks, seal segments and combustor liners must be increased.

Ceramic matrix composites (CMCs) may be a candidate for inclusion in the hot sections where higher gas turbine engine operating temperatures are required. One benefit of CMC engine components is the high-temperature mechanical, physical, and chemical properties of the CMCs which allow the gas turbine engines to operate at higher temperatures than current engine.

SUMMARY

The present disclosure may comprise one or more of the following features and combinations thereof.

According to an aspect of the present disclosure, an assembly for use in a gas turbine engine is taught. The assembly may comprise a ceramic matrix composite component, a metallic component spaced apart from the ceramic matrix composite component, and a spacer. The spacer may have a first surface in contact with the ceramic matrix composite and a second surface opposite the first surface in contact with the metallic component, the spacer may comprise a ceramic matrix composite substantially free of silicon metal with a porosity of between about 5 percent and about 40 percent by volume to chemically isolate the ceramic matrix composite component from the metallic component.

In some embodiments the metallic component may comprise a recess along a surface of the metallic component and the spacer may be positioned within the recess of the metallic component. The metallic component may comprise a chemical element that forms a eutectic with silicon. The spacer may be a preform of fibers selected from a group consisting of a silicon carbide-silicon carbide ceramic matrix composite, an oxide-oxide ceramic matrix composite, a polymer-infiltration-pyrolysis ceramic matrix composite, or a combination thereof.

In some embodiments the ceramic matrix composite may comprise a preform of ceramic fibers and a ceramic layer coating the ceramic fibers. In some embodiments, the ceramic fibers may be silicon carbide and the ceramic layer may be silicon carbide.

In some embodiments the stiffness of the spacer may be between about 5 msi and about 40 msi. The spacer may have a thickness between about 0.02 inches and about 0.04 inches. The width of the spacer may be between about 0.1 inches and about 0.15 inches.

According to another aspect of the present disclosure another assembly for use in a gas turbine engine is taught. The assembly may comprise a ceramic matrix composite component, a metallic component spaced apart from the ceramic matrix composite component, and a seal. The seal may be positioned between the ceramic matrix composite component and the metallic component; the seal may comprise a porous ceramic matrix composite to inhibit air passage between the ceramic matrix composite component and the metallic component.

In some embodiments, the seal may be a full segment and may be in contact with the ceramic matrix composite component and the metallic component to prevent passage of cooling air between the metallic component and the ceramic matrix composite component.

In some embodiments, seal may be a partial segment in contact with either the ceramic matrix component or the metallic component to allow a selected amount of cooling air to pass between the metallic component and the ceramic matrix composite component.

In some embodiments, the metallic component may comprise a recess along a surface of the metallic component for holding the seal. The metallic component may comprise a chemical element that forms a eutectic with silicon.

In some embodiments, the seal may be a preform of fibers selected from a group consisting of a silicon carbide-silicon carbide ceramic matrix composite, an oxide-oxide ceramic matrix composite, a polymer-infiltration-pyrolysis ceramic matrix composite, or any combination thereof. The stiffness of the seal may be between about 5 msi and about 40 msi. The seal may have a thickness between about 0.02 inches and about 0.04 inches. The width of the seal may be between about 0.1 inches and about 0.15 inches.

According to another aspect of the present disclosure a method for forming a ceramic composite spacer for use in a gas turbine engine is taught. The method may comprise forming a ceramic composite spacer comprising fibers. The ceramic composite spacer may have a porosity of between about 5 percent and about 40 percent by volume, positioning a first surface of the ceramic composite spacer to contact a silicon containing ceramic matrix composite component, and positioning a second surface of the ceramic composite spacer within a recess of a metallic component. In some embodiments forming the ceramic composite spacer comprises chemical vapor infiltrating silicon carbide onto a perform of silicon carbide fibers.

These and other features of the present disclosure will become more apparent from the following description of the illustrative embodiments

DETAILED DESCRIPTION OF THE DRAWINGS

Figure 1:
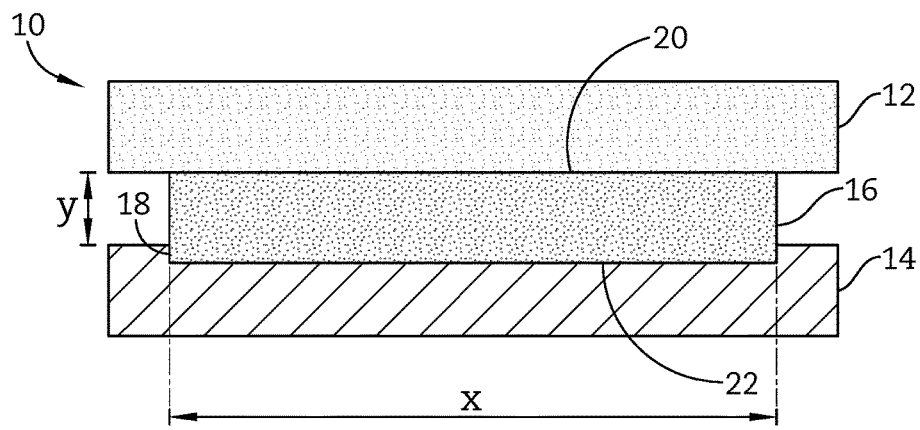
FIG. 1 is a detail view of a spacer sandwiched between a ceramic component and a metallic component, positioned within a recess of the metallic component.

For the purposes of promoting an understanding of the principles of the disclosure, reference will now be made to a number of illustrative embodiments illustrated in the drawings and specific language will be used to describe the same.

An illustrative assembly 10 for use in a gas turbine engine may include a CMC component 12, a metallic component 14 spaced apart from the CMC component 12, and a spacer 16 sandwiched between the CMC component 12 and the metallic component 14, as shown in FIG. 1. In the absence of spacer 16, the CMC component 12 may chemically interact with the metallic component 14. The interaction between the CMC component 12 and the metallic component 14 may lead to unintentional chemical bonding, reduction of strength, and degradation of the components. The spacer 16 sandwiched between the CMC component 12 and the metallic component 14 may inhibit the chemical interaction between the CMC component 12 and the metallic component 14. The spacer 16 may act as a spacer or may be a seal. The spacer 16 is also described herein as a seal, full segment, or partial segment and properties of the spacer 16 described with each example or illustrative embodiment are applicable to the other examples or embodiments described herein.

The CMC component 12 may be a CMC comprising ceramic fibers within a ceramic matrix. The CMC component 12 may be fabricated by first forming a preform of ceramic fibers. For example, the ceramic fibers may be fibers comprising silicon carbide. Chemical vapor infiltration (CVI) may be used to build up one or more layers onto the ceramic fibers. For example, a silicon carbide may be deposited onto the ceramic fibers. Furthermore, an intermediate layer such as boron nitride may be deposited prior to the silicon carbide layer. A slurry may then be infiltrated into the preform. The slurry may comprise particles of carbon and optionally silicon carbide. After slurry infiltration, the preform may be infiltrated with molten silicon metal. The silicon metal and carbon forms silicon carbide to create a matrix between the fibers resulting in a dense CMC component 12. However, the CMC component 12 may include residual silicon metal after being formed.

The presence of the silicon metal may pose a problem when CMC component 12 comes into contact with a nickel containing metallic component, such as metallic component 14. When in contact, the nickel and silicon may form a eutectic such as nickel silicide. The reaction may also promote silicon diffusion into the nickel metallic components 14 and nickel diffusion into the CMC component 12.

The metallic component 14 may include a recess 18 along a surface of the metallic component 14, as shown in FIG. 1.

The recess may be a dip or a cut out for holding or positioning the spacer 16. As described above, the metallic component 14 may include nickel, cobalt, or any other chemical element that may form a low melting point eutectic with silicon.

The spacer 16 may include a first surface 20 in contact with the CMC component 12, and a second surface 22 opposite the first surface 20, the second surface 22 in contact with the metallic component 14, as shown in FIG. 1. The first surface 20 and the second surface 22 of spacer 16 may include substantially the same material. The spacer 16 may be a preform of fibers selected from a group consisting of a silicon carbide-silicon carbide CMC, an oxide-oxide CMC, a polymer-infiltration-pyrolysis CMC, or a combination thereof.

The spacer 16 may be formed by utilizing the initial process steps to form the CMC component 12 described herein. For example, the spacer 16 may be fabricated by first forming a preform of ceramic fibers. The ceramic fibers may be fibers comprising silicon carbide. Chemical vapor infiltration (CVI) may be used to build up one or more layers onto the ceramic fibers. For example, a silicon carbide may be deposited onto the ceramic fibers. Furthermore, an intermediate layer such as boron nitride may be deposited prior to the silicon carbide layer. The deposited layer or layers may increase the stiffness of the preform of ceramic fibers.

The spacer 16 may be between about 0.02 inches thick and about 0.04 inches thick from the first surface 20 to the second surface 22. The thickness of spacer 16 may be measured in the y-direction, as shown in FIG. 1. A width of the spacer 16 may be between about 0.1 inches and about 0.15 inches, wherein the width may be measured in the x-direction. The x-direction may measure the distance opposite the thickness, or may be aligned with the x-axis of the coordinate system. The x-axis refers to the alignment of the spacer 16, as shown in FIG. 1, but does not refer to the spacer while in use in a gas turbine engine.

In some instances the preform of fibers may be positioned in one of a 5 harness satin, an 8 harness satin, or a randomized pattern to form a weave. The 5 harness satin may be formed by having a fill fiber go under 1 warp fiber and over 4 warp fibers. The 8 harness satin may be formed by having a fill fiber go under 1 warp fiber and over 7 warp fibers. The fill fibers may be the fibers which actually weave in and out (or up and down), while the warp fibers may not move during the weaving process. In some instances, the preform of fibers may also be positioned uni-directionally, may be braided, or may be arranged in any combination. The preform of fibers may be staggered for up and under to spread the strongest areas. The preform of fibers may be formed into a weave. The weave may be stacked in one of an alternating weave, an x-directional weave, or a y-directional weave. The x-direction weave may also be considered a 0 layup. The y-directional weave may be one of a 90 layup and alternating may be a 0, 90 layup. The terms 0 and 90 refer to 0 degrees and 90 degrees.

The spacer 16 may act as a compliant layer and may reduce stress concentration and transfer loads between the CMC component 12 and the metallic component 14. The metallic component 14 and the CMC component 12 may have different coefficients of thermal expansion. Higher stress levels between the CMC component 12 and the metallic component 14, when compared to a metallic component being joined to a metallic component, may cause the metallic component to creep, or shearing of the CMC component 12 from the metallic component 14. The spacer 16 may reduce stress levels by reducing the interaction between the CMC component 12 an the metallic component 14 to reduce the risk of creep and/or sheering. The spacer 16 layer may have a lower stiffness and higher compliance than the stiffness and/or compliance of the CMC component 12 and/or the metallic component 14. For example, in some instances the stiffness of the spacer 16 may be between about 5 msi and about 40 msi. In some instances, the spacer 16 may have a porosity of between about 5 percent and about 40 percent by volume. The porosity may vary based on the stiffness of the spacer 16. For example at 40 msi the porosity may be between about 5% and about 10%. The compliance may be measured as 1 over the stiffness.

Figure 2:
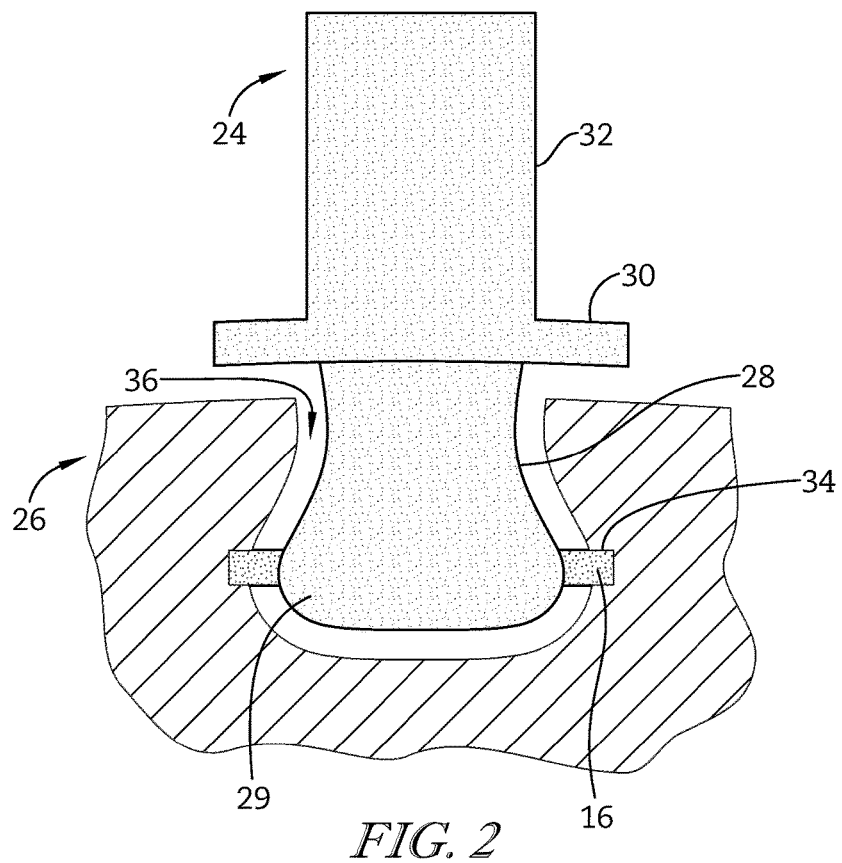
FIG. 2 is a detail view of a ceramic composite turbine blade including an airfoil, a platform and a dovetail attachment feature, positioned within a turbine disk, including a spacer positioned within the recess of the turbine disk to inhibit the chemical reaction between the ceramic composite and the metallic component.

FIG. 2 shows one illustrative example of spacer 16. The spacer 16 may be placed between a CMC blade 24 and a metallic turbine disk 26. The CMC blade 24, adapted for use in a gas turbine engine, may include a root 28, a platform 30 coupled to the root 28, and an airfoil 32 opposite the root 28 coupled to the platform 30. The root 28 of the CMC blade 24 may be adapted to include attachment features 29. The attachment features 29 may include a dovetail attachment, or a fir tree attachment. The attachment features 29 may be adapted to mate with corresponding features formed in a turbine disk 26 to couple the blade 24 to the turbine disk 26.

The metallic turbine disk 26 may be adapted to include a recess 34 along the edge of the metallic turbine disk 26 for inserting, holding, or positioning the spacer 16, as shown in FIG. 2. A plurality of recesses 34 may be used to hold a plurality 16 of spacers 16. In some instances, the spacers 16 may fill the entire space 36 between the metallic turbine disk 26 and the CMC blade 24 creating a continuous layer between the metallic turbine disk 26 and the CMC blade 24. In some examples, the recess 34 may not be present, but instead the spacer 16 may float freely in the space 36 between the CMC blade 24 and the metallic turbine blade 26.

The spacer 16 between the CMC blade 24 and the metallic turbine disk 26 may be adapted to act as a compliant layer between the CMC blade 24 and the metallic turbine disk 26. One possible method for determining the number of spacers 16 and recesses 34 may be based on stress concentration reduction and/or transferring loads between the blade 24 and the metallic turbine disk 26.

Figure 3:
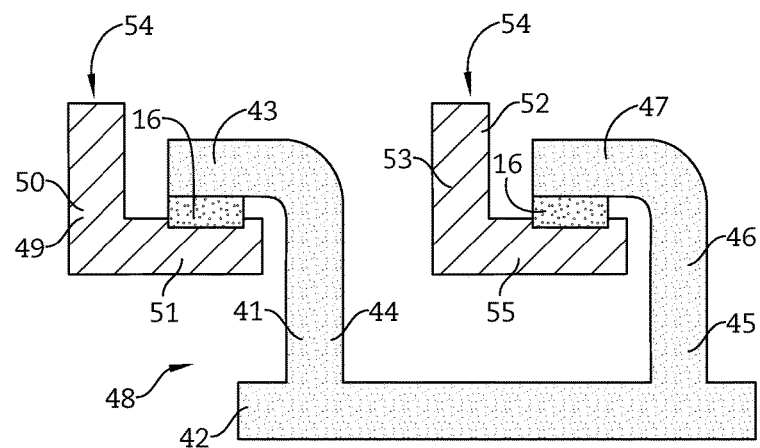
FIG. 3 is a detail view of a turbine shroud included in a turbine section showing a blade track held in place by a carrier and a spacer chemically isolating the carrier from the blade track.

FIG. 3 shows another illustrative example in which spacer 16 may be positioned at interfaces of a carrier 54 and a blade track 48. The carrier 54 may be an annular, round, metallic component and may support the blade track 48 in position adjacent to the blades of a turbine wheel assembly. The illustrative blade track 48 may include silicon-containing CMC materials. The blade track 48 may engage the carrier 54 to position the blade track 48 relative to other static turbine components in a gas turbine engine.

The carrier 54 may include a forward hanger 50, and an aft hanger 52, as shown in FIG. 3. The forward hanger 50 illustratively may have a radially-extending portion 49 and an axially-extending portion 51 for hanging the blade track 48. The aft hanger 52, like the forward hanger 50, illustratively may have a radially-extending portion 53 and an axially-extending portion 55 for hanging the blade track 48, as shown in FIG. 3. The illustrative carrier 54 may include a metallic alloy. The metallic alloy may include nickel, cobalt, or any other element that may form a low melting point eutectic with silicon. The carrier 54 may be adapted to include a recess along the axially-extending portion 51 of the forward hanger 50 and/or along the axially-extending portion 55 of the aft hanger 52 for positioning or holding the spacer 16.

The illustrative blade track 48 (sometimes called a seal ring) may be included of a silicon-containing CMC. The blade track 48 may include a forward attachment arm 44 and an aft attachment arm 46 attached to a runner 42, as shown in FIG. 3. The blade track 48 may engage the carrier 54 to position the blade track 48 relative to other static components in a gas turbine engine.

The blade track 48 may include a runner 42, a forward attachment arm 44 and an aft attachment arm 46, as shown in FIG. 3. The runner 42 may extend around a turbine wheel assembly to block gasses from passing over turbine blades. The forward attachment arm 44 may have a radially-extending portion 41 and may have an axially-extending portion 43. The aft attachment arm 46 may have a radially-extending portion 45 and an axially-extending portion 47 for attaching to the carrier 54. The blade track 48 may include or be formed of a CMC containing silicon.

The spacer 16 may be positioned at the interface of the axially-extending portion 51 of the forward hanger 49 and the axially-extending portion 43 forward attachment arm 44, as shown in FIG. 3. The spacer 16 may also be positioned at the interface of the axially extending portion 47 of the aft attachment arm 46 and the axially extending portion 55 of the aft hanger 52. The spacer 16 may be a full spacer 16 to block air passage, or it may be a segmented spacer 16 to partially block air passage. The spacer 16 may also provide at least three points of contact between the carrier 54 and the blade track 48. The spacer 16 may be positioned within a recess and/or the spacer 16 may float freely between the carrier 54 and the blade track 48.

Figure 4:
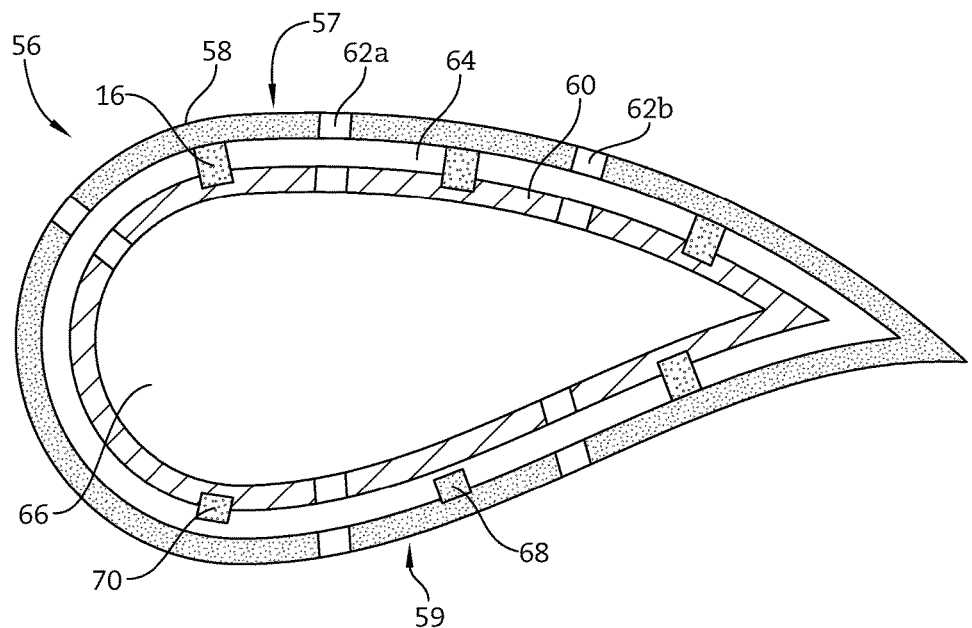
FIG. 4 is a detail view of a turbine vane showing a fully segmented seal or spacer sandwiched between the ceramic component and the metallic component to chemically isolate the ceramic matrix composite component from the metallic component, while also preventing air flow, and a partially segmented seal or spacer for allowing a selected amount of cooling air to pass between the ceramic matrix composite component and the metallic component.

FIG. 4 shows another illustrative example for spacer 16. The spacer 16 may be positioned between an airfoil 58 and a spar 60 of a vane or blade 56. Illustratively the vane 56 may include an airfoil 58, a reinforcement spar 60, and a hollow core 66.

The airfoil 58 may be adapted to include a convex suction side 57 and a concave pressure side 59, as shown in FIG. 4. The airfoil 58 may be a CMC and more specifically may include silicon. The airfoil 58 may be able to withstand the high temperature, high pressure environment of the gas turbine engine.

The vane 56 may be adapted to include cooling channels 64 and cooling holes 62a, and 62b to allow for cooling air to traverse from the hollow core 66 to and out the cooling holes 62a, 62b and cooling channels 64, as shown in FIG. 4. The vane 56 may further include a reinforcement spar 60. The reinforcement spar 60 may include a metallic material such as nickel, cobalt, or any other elements that form a eutectic with silicon.

In some examples, the spacer 16 is a full segment 16 or a partial segment 68, 70, as shown in FIG. 4. The full segment 16 may also act as a seal to inhibit airflow between the airfoil 58 and the spar 60. The full segment 16 or full seal segment may be in contact with the airfoil 58 and the spar 60 and may inhibit substantially all of the airflow between the airfoil 58 and the spar 60. Segmentation of the spacer in the airfoil spanwise direction may be possible and may be desired.

The partial segment 70 may be considered a partial seal segment and may contact the spar 60 to allow a selected amount of cooling air to pass between the spar 60 and the airfoil 58, as shown in FIG. 4. In other examples, the partial segment 68 may be in contact with the airfoil 58 to allow a selected amount of cooling air to pass between the spar 60 and the airfoil 58.

The spacer 16 may be positioned to sit within a recess along the surface of the spar 60. In some examples, the seal 16 may be positioned to float between the spar 60 and the airfoil 58 and may not be positioned within a recess along the spar 60.

One illustrative method for forming a spacer, such as the spacer 16 described herein, may include forming a ceramic composite spacer 16 comprising a preform of fibers, positioning the first surface of the spacer to contact the CMC component, and positioning the second surface within a recess of the metallic component.

A spacer 16 may be formed by a similar method to producing a CMC component. The preform may go through CVI or CVD, without going through the subsequent steps of slurry infiltration and melt infiltration, as described herein. The preform may go through CVI, CVD, or polymer-infiltration-pyrolysis. In some examples, the spacer 16 may be an oxide-oxide.

CVI may be used to build up one or more layers onto the preform of silicon carbide fibers. Silicon carbide may be deposited onto the fibers to form one or more layers of silicon carbide on the silicon carbide fibers. Furthermore, an intermediate layer such as boron nitride may be deposited prior to the silicon carbide layer. The deposition of silicon carbide and/or boron nitride may occur while the preform is in the furnace to provide a coating around the fibers of the preform. The starting material for CVI may include a gaseous precursor controlled by quartz tubes and may be performed at temperatures between about 900° C. and about 1300° C. CVI may use low pressure and multiple cycles in the furnace.

The preform may be taken out after a first pass through the furnace and weighed. If the preform is not at the target weight it may go through the furnace for another run, which may occur as many times as necessary in order to achieve the target weight. The target weight may be determined by the final part to be made.

After CVI, the spacer may be positioned such that a first surface 20 of the spacer 16 may be in contact with the silicon metal containing CMC component, as shown in FIG. 1. A second surface 22 may be opposite the first surface 20 and may in contact with the metallic component 14. The second surface 22 may be positioned within a recess 18 of the metallic component 14.

The spacer 16 may include a preform of silicon carbide fibers prior to undergoing CVI or CVD. The preform of fibers may include fibers with a diameter between about 7 um and about 150 um. A coating of silicon carbide may be applied to coat the fibers with a coating of thickness between about 2 and about 200 um. In other examples, boron nitride may be applied to coat the fibers with a coating thickness of between about 0.1 um and about 1.0 um.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. An assembly for use in a gas turbine engine, the assembly comprising
   a ceramic matrix composite component, wherein the ceramic matrix composite component comprises a preform including (1) ceramic fibers and (2) a ceramic matrix or a ceramic layer,
   a metallic component spaced apart from the ceramic matrix composite component, and
   a spacer having a first surface in contact with the ceramic matrix composite and a second surface opposite the first surface in contact with the metallic component, the spacer comprising a ceramic matrix composite substantially free of silicon metal with a porosity of between about 5 percent and about 40 percent by volume to chemically isolate the ceramic matrix composite component from the metallic component, wherein the ceramic matrix composite of the spacer comprises a preform including (1) ceramic fibers and (2) a ceramic matrix or a ceramic layer.

2. The assembly of claim 1, wherein the metallic component comprises a recess along a surface of the metallic component and the spacer is positioned within the recess of the metallic component.

3. The assembly of claim 1, wherein the metallic component comprises a chemical element that forms a eutectic with silicon.

4. The assembly of claim 1, wherein the ceramic matrix composite of the spacer is selected from a group consisting of a silicon carbide-silicon carbide ceramic matrix composite, an oxide-oxide ceramic matrix composite, a polymer-infiltration-pyrolysis ceramic matrix composite, or a combination thereof.

5. The assembly of claim 1, wherein the ceramic fibers are silicon carbide and the ceramic layer is silicon carbide.

6. The assembly of claim 1, wherein the stiffness of the spacer is between about 5 msi and about 40 msi.

7. The assembly of claim 1, wherein the spacer has a thickness between about 0.02 inches and about 0.04 inches.

8. The assembly of claim 1, wherein the width of the spacer is between about 0.1 inches and about 0.15 inches.

9. An assembly for use in a gas turbine engine, the assembly comprising
   a ceramic matrix composite component, wherein the ceramic matrix composite component comprises a preform including (1) ceramic fibers and (2) a ceramic matrix or a ceramic layer,
   a metallic component spaced apart from the ceramic matrix composite component,
   a seal positioned between the ceramic matrix composite component and the metallic component, the seal including a porous ceramic matrix composite to inhibit air passage between the ceramic matrix composite component and the metallic component, wherein the porous ceramic matrix composite of the seal comprises a preform including (1) ceramic fibers and (2) a ceramic matrix or a ceramic layer.

10. The assembly of claim 9, wherein the seal is a full segment and is in contact with the ceramic matrix composite component and the metallic component to prevent passage of cooling air between the metallic component and the ceramic matrix composite component.

11. The assembly of claim 9, wherein the seal is a partial segment in contact with at least one of the ceramic matrix component or the metallic component to allow a selected amount of cooling air to pass between the metallic component and the ceramic matrix composite component.

12. The assembly of claim 9 wherein the metallic component comprises a recess along a surface of the metallic component for holding the seal.

13. The assembly of claim 12, wherein the metallic component comprises a chemical element that forms a eutectic with silicon.

14. The assembly of claim 9, wherein the ceramic matrix composite of the seal is selected from a group consisting of a silicon carbide-silicon carbide ceramic matrix composite, an oxide-oxide ceramic matrix composite, a polymer-infiltration-pyrolysis ceramic matrix composite, or any combination thereof.

15. The assembly of claim 9, wherein the stiffness of the seal is between about 5 msi and about 40 msi.

16. The assembly of claim 9, wherein the seal has a thickness between about 0.02 inches and about 0.04 inches.

17. The assembly of claim 9, wherein the width of the seal is between about 0.1 inches and about 0.15 inches.

18. A method for forming a ceramic matrix composite spacer for use in a gas turbine engine, the method comprising
    forming a ceramic matrix composite spacer comprising (1) fibers and (2) a ceramic matrix or a ceramic layer, wherein the ceramic matrix composite spacer comprises a porosity of between about 5 percent and about 40 percent by volume, and wherein the ceramic matrix composite spacer is substantially free of silicon metal,
    positioning a first surface of the ceramic matrix composite spacer to contact a silicon containing ceramic matrix composite component, wherein the ceramic matrix composite component comprises (1) fibers and (2) a ceramic matrix or a ceramic layer, and
    positioning a second surface of the ceramic matrix composite spacer within a recess of a metallic component.

19. The method of claim 18, wherein the forming the ceramic matrix composite spacer comprises chemical vapor infiltrating silicon carbide onto a preform of silicon carbide fibers.

\* \* \* \* \*